US010185511B2

(12) United States Patent
Sharma et al.

(10) Patent No.: US 10,185,511 B2
(45) Date of Patent: Jan. 22, 2019

(54) TECHNOLOGIES FOR MANAGING AN OPERATIONAL CHARACTERISTIC OF A SOLID STATE DRIVE

(71) Applicant: Intel Corporation, Santa Clara, CA (US)

(72) Inventors: Neeraj Sharma, Folsom, CA (US); Ning Wu, Folsom, CA (US); Steven E. Wells, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 14/979,125

(22) Filed: Dec. 22, 2015

(65) Prior Publication Data

US 2017/0177262 A1 Jun. 22, 2017

(51) Int. Cl.
*G06F 3/06* (2006.01)
*G11C 7/04* (2006.01)

(52) U.S. Cl.
CPC .......... *G06F 3/0634* (2013.01); *G06F 3/0616* (2013.01); *G06F 3/0653* (2013.01); *G06F 3/0673* (2013.01); *G06F 3/0679* (2013.01); *G11C 7/04* (2013.01)

(58) Field of Classification Search
CPC ........ G06F 3/06; G06F 3/0616; G06F 3/0634; G06F 3/0653; G06F 3/0673; G06F 3/0679; G11C 7/04
USPC .......................................... 711/103, 154, 152
See application file for complete search history.

(56) References Cited

U.S. PATENT DOCUMENTS

| 8,862,806 B2 * | 10/2014 | Yoon ..................... G06F 3/0613 711/102 |
| 8,984,216 B2 * | 3/2015 | Fillingim ............ G06F 11/3485 711/103 |
| 2010/0169585 A1 * | 7/2010 | Steinbrecher ............ G11C 7/04 711/154 |
| 2012/0047319 A1 * | 2/2012 | Yoon ..................... G06F 3/0613 711/103 |
| 2012/0124273 A1 * | 5/2012 | Goss .................... G11C 16/349 711/103 |
| 2012/0331207 A1 | 12/2012 | Lassa et al. |
| 2013/0080679 A1 | 3/2013 | Bert |

(Continued)

FOREIGN PATENT DOCUMENTS

WO 2015-183585 12/2015

OTHER PUBLICATIONS

International search report for PCT application No. PCT/US2016/063359, dated Feb. 28, 2017 (3 pages).

(Continued)

*Primary Examiner* — Pierre Miche Bataille
(74) *Attorney, Agent, or Firm* — Barnes & Thornburg LLP

(57) ABSTRACT

Technologies for managing an operational characteristic of a solid state drive include monitoring the operational characteristic to determine whether the operational characteristic satisfies a low threshold and a high threshold. If the operational characteristic does satisfy the low threshold, the solid state drive throttles high power memory accesses requests while not throttle low power memory access requests. If the operational characteristic satisfies a high threshold, the solid state drive is configured to throttle all memory accesses. The operational characteristic may be embodied as, for example, a temperature of the solid state drive.

22 Claims, 6 Drawing Sheets

(56) References Cited

U.S. PATENT DOCUMENTS

| | | |
|---|---|---|
| 2013/0173941 A1 | 7/2013 | Ananthakrishna et al. |
| 2015/0169021 A1 | 6/2015 | Salessi et al. |
| 2015/0236926 A1* | 8/2015 | Wright ................ H04L 41/5022 709/224 |
| 2015/0378412 A1* | 12/2015 | Suryanarayanan ... G06F 1/3206 713/340 |
| 2016/0170642 A1* | 6/2016 | Miyamoto .............. G06F 3/061 711/103 |
| 2017/0031409 A1* | 2/2017 | Lester ....................... G06F 1/30 |
| 2017/0060442 A1* | 3/2017 | Dunn ................... G06F 3/0608 |

OTHER PUBLICATIONS

Written opinion for PCT application No. PCT/US2016/063359, dated Feb. 28, 2017 (5 pages).

* cited by examiner

TECHNOLOGIES FOR MANAGING AN OPERATIONAL CHARACTERISTIC OF A SOLID STATE DRIVE

BACKGROUND

Solid state drives (SSDs) are data storage devices that rely on memory integrated circuits to store data in a non-volatile or persistent manner. Unlike typical disk drives, solid state drives do not include moving, mechanical parts, such as a movable drive head and/or drive spindle. As such, solid state drives are generally more durable to physical contact (e.g., bumping) during operation and operate more quietly than traditional disk drives. Due to the reliance on solid state memory devices to store data, solid state drives generally exhibit lower access time relative to typical disk drives.

Typical solid state drives monitor operational characteristics, such as operational temperature, during use. Under heavy workloads, the temperature of a solid state drive may rise to undesirable levels. To reduce the operational temperature, typical solid state drives reduce the performance by throttling both read and write accesses. Such throttling can reduce or maintain the operational temperature of the solid state drive to acceptable levels.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
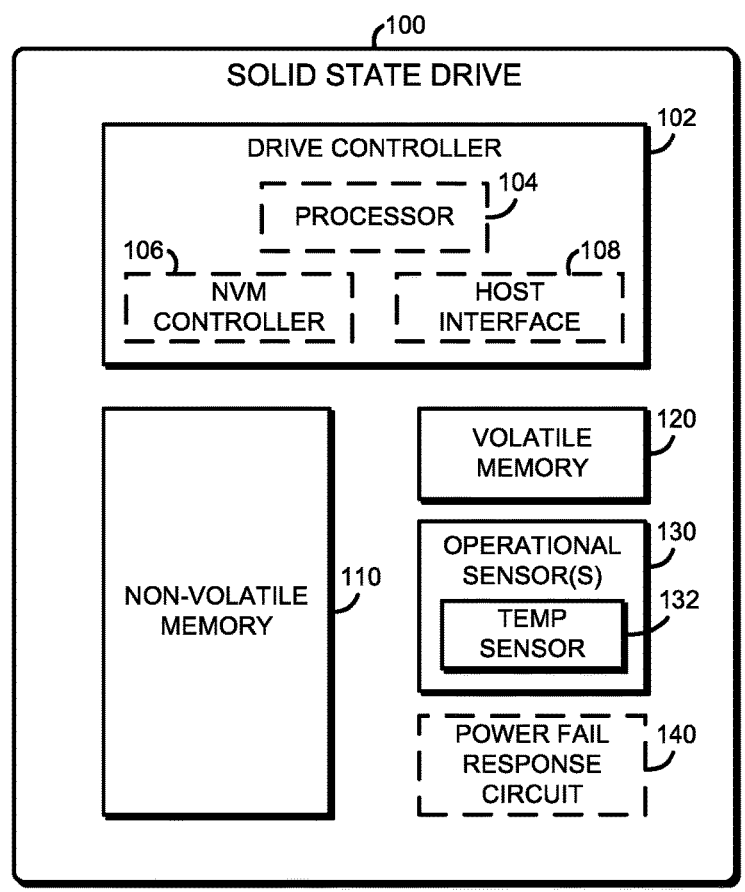
FIG. 1 is a simplified block diagram of at least one embodiment of a solid state drive configured to throttle performance based on an operational characteristic.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative solid state drive 100 includes a drive controller 102, a non-volatile memory 110, a volatile memory 120, and one or more operational characteristic sensors 130. The operational characteristic sensor 130 may be embodied as any type of sensor(s) capable of sensing an operational characteristic or parameter of the solid state drive 100. For example, in the illustrative embodiment, the operational characteristic sensor 130 is embodied as, or otherwise includes, a temperature sensor 132 configured to sense an operational temperature of the solid state drive 100 during operation. In use, as discussed in more detail below, the drive controller 102 is configured to monitor the operational characteristic (e.g., temperature) sensed by the operational characteristic sensor 130 and adjust performance of the solid state drive 100 based on the operational characteristic.

To adjust the performance of the solid state drive 100, the drive controller 102 is configured to throttle memory accesses based on the operational characteristics. It should be appreciated that some types of memory accesses are more power demanding than other types of memory accesses. For example, in many solid state drives (e.g., those solid state drives utilizing NAND storage devices), a write access requires more power than a read access due activation of additional circuitry during the write access, which are not required during a read access. Of course, in other solid state drives and/or memory technologies, read accesses (or other types of accesses) may demand more power than write accesses. Regardless, it should be appreciated that the different types of memory accesses may have different magnitudes of impact on the operational characteristics. Accordingly, the drive controller 102 is configured to throttle memory accesses based on the type of the memory access and the operational characteristic. More specifically, the drive controller 102 is configured to throttle high power memory access requests, such as write requests, while not throttling low power memory access requests, such as read requests, in response to the operational characteristic satisfying a low threshold (e.g., a lower temperature threshold). If, however, the sensed operational characteristic also satisfies a high threshold (e.g., a high temperature threshold), the drive controller 102 may be configured to throttle all memory access requests. It should be appreciated that by only throttling high power memory access requests in some situations, the overall performance and user experience of the solid state drive 100 may be improved relative to schemes in which all memory access requests are throttled, especially in those situations in which the lower power memory access requests are more abundant.

The drive controller 102 of the solid state drive 100 may be embodied as any type of control device, circuitry, or collection of hardware devices capable of controlling operation of the solid state drive 100 and performing the functions described herein. In the illustrative embodiment, the drive controller 102 includes a processor or processing circuitry 104, a non-volatile memory controller 106, and a host interface 108. Of course, the drive controller 102 may include additional devices, circuits, and/or components commonly found in a drive controller of a solid state drive in other embodiments.

The processor 104 may be embodied as any type of hardware processor or processing circuitry capable of performing the functions described herein. For example, the processor 104 may be embodied as a single or multi-core processor(s), digital signal processor, microcontroller, or other processor or processing/controlling circuit. In the illustrative embodiment, the processor 104 controls and manages operation of other components of the drive controller 102.

Similar to the processor 104, the non-volatile memory controller 106 may be embodied as any type of hardware processor, processing circuitry, or collection of devices capable of managing the non-volatile memory 110. In use, the non-volatile memory controller 106 manages read and write access to the non-volatile memory 110. Additionally, the non-volatile memory controller 106 may manage various metadata associated with the non-volatile memory 110 such as a logical-to-physical indirection table and/or other metadata related to the data stored in the non-volatile memory 110.

In some embodiments, the processor 104 and the non-volatile memory controller 106 may be embodied as the same hardware processor, processing circuitry, and/or collection of devices. Additionally, in some embodiments, the processor 104 and the non-volatile memory controller 106 may form a portion of a System-on-a-Chip (SoC) and be incorporated, along with other components of the drive controller 102, onto a single integrated circuit chip.

The host interface 108 may also be embodied as any type of hardware processor, processing circuitry, input/output circuitry, and/or collection of components capable of facilitating communication of the solid state drive 100 with a host device or service (e.g., a host application). That is, the host interface 108 embodies or establishes an interface for accessing data stored on the solid state drive 100. To do so, the host interface 108 may be configured to utilize any suitable communication protocol and/or technology to facilitate communications with the solid state drive 100. For example, the host interface 108 may be configured to communicate with a host device or service using Non-Volatile Memory Express (NVMe), Serial Advanced Technology Attachment (SATA), Peripheral Component Interconnect express (PCIe), Serial Attached SCSI (SAS), Universal Serial Bus (USB), and/or other communication protocol and/or technology.

The non-volatile memory 110 may be embodied as any type of non-volatile memory capable of storing data in a persistent manner. In the illustrative embodiment, the non-volatile memory 110 is embodied as NAND flash memory, but other types of non-volatile memory may be used in other embodiments including, but not limited to, three-dimensional (3D) cross point memory or other types of bit addressable, write-in-place non-volatile memory, NOR flash memory, phase change memory (PCM), electrically erasable programmable read-only memory (EEPROM), resistive memory, nanowire memory, ferro-electric transistor random access memory (FeTRAM), magnetoresistive random access memory (MRAM), spin transfer torque MRAM, and/or other non-volatile memory. It should be appreciated that the non-volatile memory 110 may be formed from multiple, discrete memory devices (e.g., multiple NAND circuit chips or dies), which may be managed and accessed by the non-volatile memory controller 106 in a parallel manner to increase the memory access speed of the solid state drive 100.

The volatile memory 120 may be embodied as any type of volatile memory capable of storing data while the solid state drive 100 is operational. In the illustrative embodiment, the volatile memory 120 is embodied as dynamic random access memory (DRAM), but may be embodied as other types of volatile memory and/or memory technologies capable of storing data while the solid state drive 100 is operational such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In some embodiments, the solid state drive 100 may also include a power fail response circuit 140. The power fail response circuit 140 is configured to provide backup power to certain components of the solid state drive 100 for a period of time in the event that power to the solid state drive 100 is unexpectedly lost. The supply of backup power allows the solid state drive 100 to copy data (e.g., a logical-to-physical indirection table, the memory context table, etc.) stored in the volatile memory 120 to the non-volatile memory 110 and/or perform other emergency procedures. To do so, the power fail response circuit 140 may include an amount of backup energy storage, such as a bank of capacitors of the like, to provide the backup power.

Figure 2:
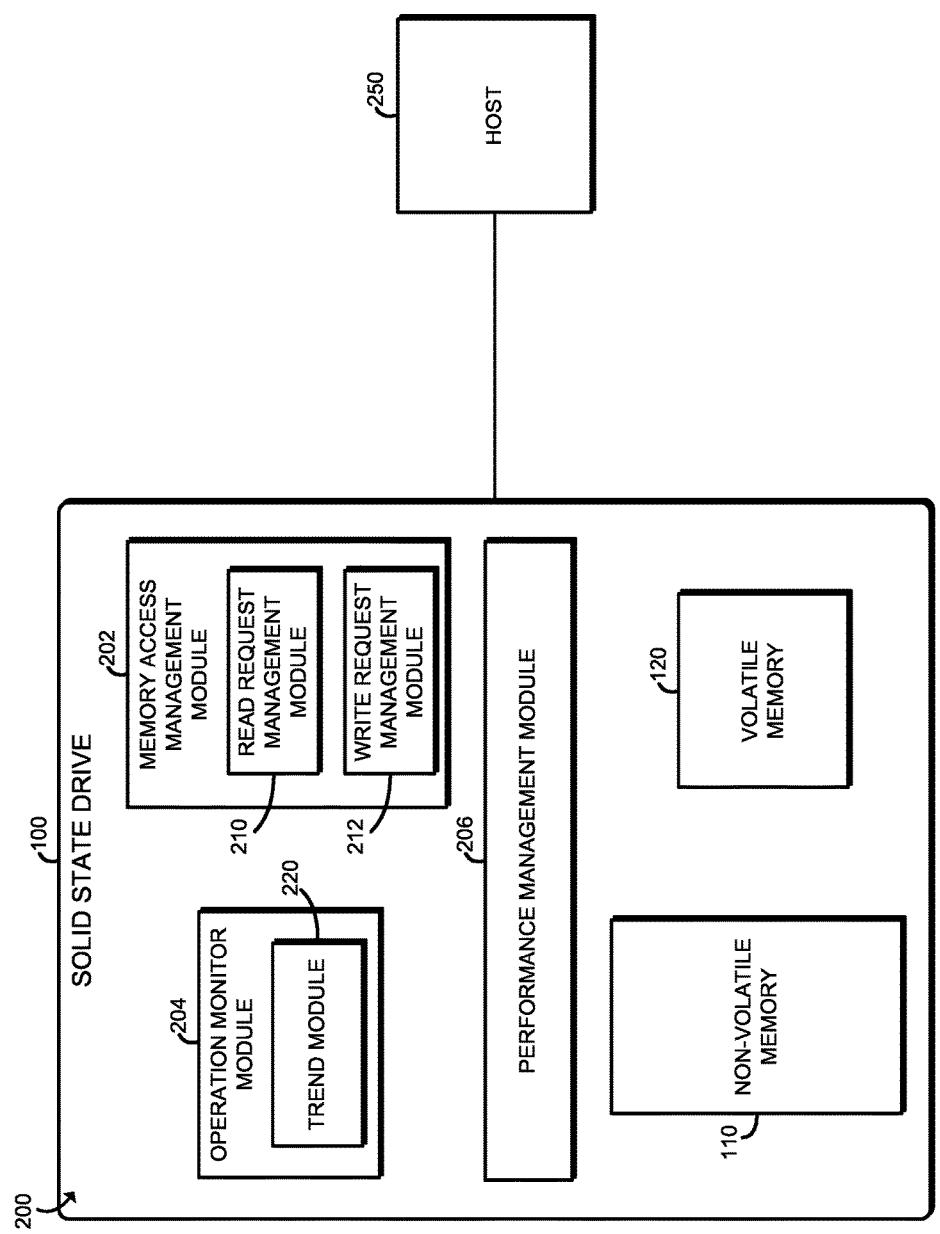
FIG. 2 is a simplified block diagram of at least one embodiment of an environment that may be established by the solid state drive of FIG. 1.

Referring now to FIG. 2, in use, the solid state drive 100 may establish an environment 200. The illustrative environment 200 includes a memory access management module 202, an operation monitor module 204, and a performance management module 206. Each of the modules and other components of the environment 200 may be embodied as firmware, software, hardware, or a combination thereof. For example the various modules, logic, and other components of the environment 200 may form a portion of, or otherwise be established by, the drive controller 102 or other hardware components of the solid state drive 100. As such, in some embodiments, any one or more of the modules of the environment 200 may be embodied as a circuit or collection of electrical devices (e.g., a memory access management circuit 202, an operation monitor circuit 204, and a performance management circuit 206, etc.). Of course, in other embodiments, the environment 200 may include additional or other modules, logic, and/or components.

The memory access management module 202 is configured to manage memory access requests received from a host 250. The host 250 may be embodied as any type of device or service requesting a memory access (e.g., a read or write access) to non-volatile memory 110 of the solid state drive 100. For example, in some embodiments, the host 250 may be embodied as a software application executed by a computing device in which the solid state drive 100 is installed. The memory access management module 202 manages the memory access requests received from the host 250 by performing the requests and sending an acknowledgement to the host 250 upon completion of the requests. In order to manage multiple memory access requests, the memory access management module 202 may queue the memory access requests and perform each memory access requests in sequential order under normal operating conditions (e.g., under non-throttling conditions as discussed below).

The illustrative memory access management module 202 includes a read request management module 210 and a write request management module 212. The read request management module 210 is configured to manage read requests received from the host 250 and/or other entities. Similarly, the write request management module 212 is configured to manage write requests received from the host 250 and/or other entities. Each of the read request management module 210 and the write request management module 212 may independently throttle performance of read and write requests, respectively. For example, under certain throttling conditions as discussed in more detail below, the write request management module 212 may be configured to throttle performance of write requests while the read request management module 210 does not throttle performance of read requests.

The operation monitor module 204 is configured to monitor one or more operational characteristics (e.g., temperature) of the solid state drive 100. To do so, the operation monitor module 204 monitors the sensor data generated by the one or more operational characteristic sensors 130. For example, in the illustrative embodiment, the operation monitor module 204 monitors the sensor data generated by the temperature sensor 132. The operation monitor module 204 is configured to compare the monitored operational characteristic to one or more thresholds. For example, in the illustrative embodiment, the operation monitor module 204 is configured to determine whether the monitored operational characteristic (e.g., temperature) satisfies a low threshold (e.g., a low temperature threshold) and a high threshold (e.g., a high temperature threshold). The operation monitor module 204 is configured to notify the performance management module 206 in response to a determination the monitored operational characteristic satisfies either the low threshold or the high threshold. For example, if the operation monitor module 204 determines that the monitored operational characteristic satisfies (e.g., is equal to or greater than) the low threshold, but does not satisfy (e.g., is not equal to or greater than) the high threshold, the operation monitor module 204 is configured to notify the performance management module 206 of such determination. Additionally, if the operation monitor module 204 determines that the monitored operational characteristic satisfies both the low threshold and the high threshold, the operation monitor module 204 is configured to notify the performance management module 206 of such determination. In this way, the operation monitor module 204 monitors the operational characteristic based on the reference threshold.

In some embodiments, the operation monitor module 204 may include a trend module 220. The trend module 220 is configured to analyze the historical trend of the monitored operational characteristic(s). To do so, in the illustrative embodiment, the trend module 220 determines the slope or derivative (i.e., change over time) of the monitored operation characteristic. The trend module 220 compares the determined historic trend of the monitored operation characteristic to a trend threshold and notifies the performance management module 206 if the historical trend satisfies (e.g., is equal to or greater than) the trend threshold. For example, the trend module 220 may monitor the temperature of the solid state drive 100 over time and, if the temperature is rising at an excessive rate, the trend module 220 may notify the performance management module 206. In response, as discussed below, the performance management module 206 may initiate throttling performance of the solid state drive 100. In this way, the performance management module 206 may preemptively throttle performance in a reduced manner to counteract heavy workloads prior to the heavy workloads requiring significant throttling of performance.

The performance management module 206 is configured to manage performance characteristics of the solid state drive 100. To do so, the performance management module 206 is configured to throttle the performance of the solid state drive 100 based on the monitored operational characteristic. However, unlike typical all-or-nothing throttling schemes, the performance management module 206 is configured to selectively throttle low power memory access requests (e.g., read requests) and high power memory requests (e.g., write requests) based on the monitored operation characteristic. For example, in the illustrative embodiment, the performance management module 206 is configured to throttle only high power memory requests if the monitored operation characteristic (e.g., temperature) satisfies the low threshold but does not satisfy the high threshold (i.e., the operation characteristic is between the low and high threshold boundaries). However, under such conditions, the performance management module 206 does not throttle the low power memory request (e.g., read requests). If, however, the monitored operation characteristic (e.g., temperature) also satisfies the high threshold, the performance management module 206 is configured to throttle both low and high power memory requests. In this way, the performance management module 206 implements multiple throttle zones in which memory requests of different power requirements are throttled in different ways. As such, the overall performance of low power memory requests may be improved under some conditions even though the performance management module 206 has initiated some corrective measure (i.e., throttling of high power memory requests). As discussed above, the performance management module 206 may also throttle high power memory requests, while not throttling low power memory requests, in response to a determination by the trend module 220 that the historical trend of the operation characteristics satisfies the trend threshold.

The performance management module 206 may utilize any suitable throttling action or mechanism to throttle the performance of the high power memory requests and/or the low power memory requests. In some embodiments, the performance management module 206 throttles memory requests by delaying the performance of the memory requests (e.g., by instructing the memory access management module 202 to delay performance). For example, under conditions in which the high power memory accesses are throttled while the low power memory accesses are not throttled, the performance management module 206 may allow performance of the low power memory accesses as normal but delay the high power memory accesses by adding a wait period between each high power memory access. Alternatively, in other embodiments, the performance management module 206 may throttle the high power memory accesses by delaying the sending of an acknowledgement to the host 250 or other requesting entity to thereby slow down the rate of high power memory access requests from that particular host 250 or other entity. It should be appreciated that, under such conditions, additional low power memory accesses may be performed between the performance of each high power memory accesses. As such, in situations in which the low power memory accesses outnumber the high power memory accesses, the overall performance of the solid state drive 100 during performance throttling may be significantly improved.

Figure 3:
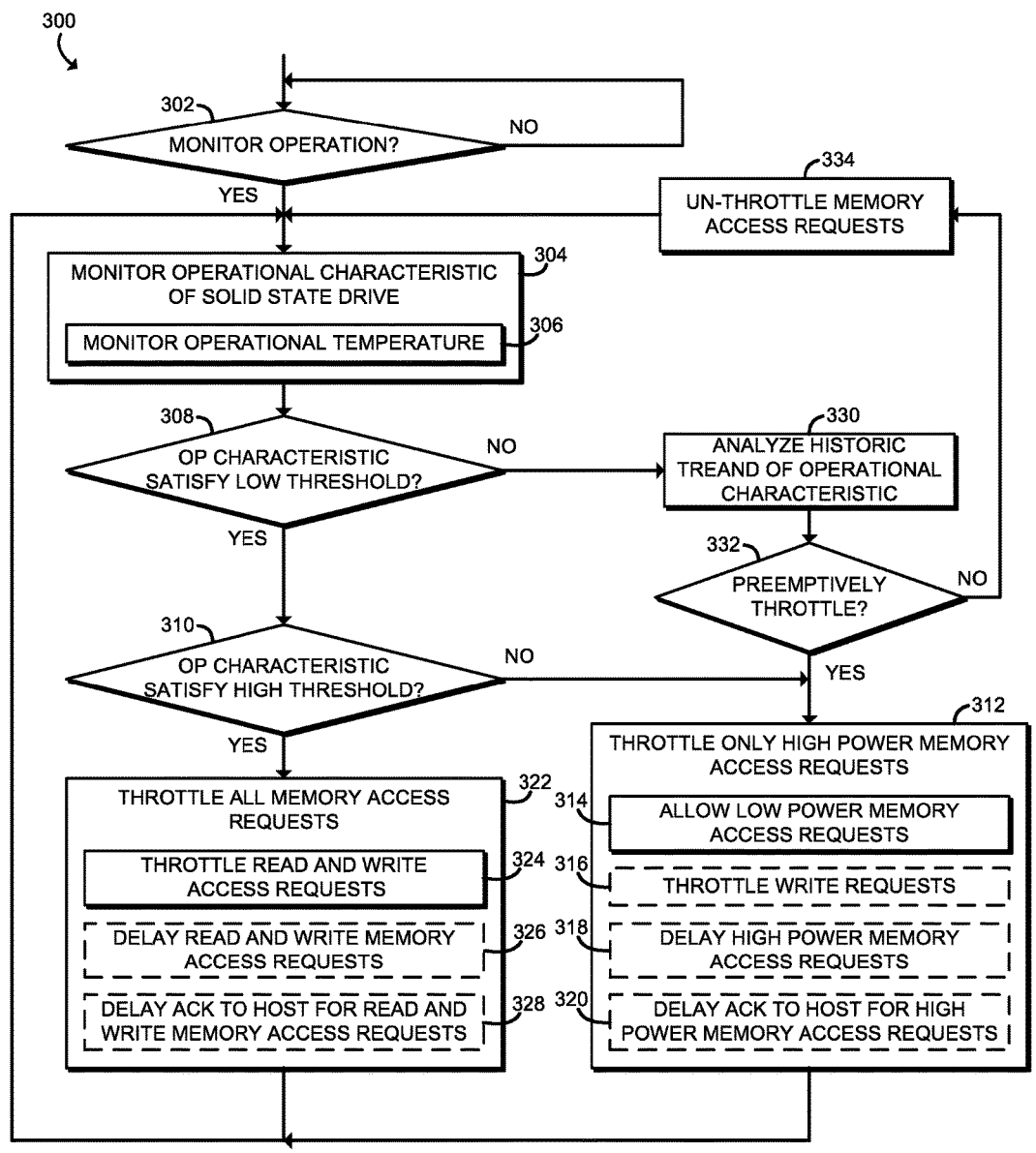
FIG. 3 is a simplified flow diagram of at least one embodiment of a method for managing an operational characteristic of the solid state drive that may be executed by a drive controller of the solid state drive of FIGS. 1 and 2.

Referring now to FIG. 3, during operation, the drive controller 102 of the solid state drive 100 may execute a method 300 for managing an operational characteristic of the solid state drive 100. The method 300 begins with block 302 in which the drive controller 102 determines whether to begin monitoring the operational characteristic(s) of the solid state drive 100. If so, the method 300 advances to block 304 in which the drive controller 102 monitors the operational characteristic of the solid state drive 100. For example, in the illustrative embodiment, the drive controller 102 monitors the operational temperature of the solid state drive 100 in block 306. To do so, the drive controller 102 is configured to monitor the sensor data generated or produced by the operational characteristic sensor 130. For example, the drive controller 102 may monitor the operational temperature of the solid state drive 100 by monitoring the temperature sensor data produced by the temperature sensor 132.

In block 308, the drive controller 102 determines whether the monitored operational characteristic satisfies a low threshold. For example, in the illustrative embodiment, the drive controller 102 determines whether the operational temperature of the solid state drive 100 satisfies a low temperature threshold. In some embodiments, the low threshold may be embodied as a predefined threshold or value. However, in other embodiments, the low threshold may be variable or otherwise determined or adjusted over time based on the operational of the solid state drive 100.

If the drive controller 102 determines that the operational characteristic satisfies the low threshold in block 308, the method 300 advances to block 310. In block 310, the drive controller 102 determines whether the monitored operational characteristic also satisfies a high threshold that is greater than the low threshold. For example, in the illustrative embodiment, the drive controller 102 determines whether the operational temperature of the solid state drive 100 also satisfies a high temperature threshold.

If the drive controller 102 determines that the operational characteristic does not satisfy the high threshold in block 310 (e.g., the operational characteristic is in-between the low threshold and the high threshold), the method 300 advances to block 312. In block 312, the drive controller 102 throttles high power memory access requests. In doing so, in block 314, the drive controller 102 allows, or otherwise does not throttle, low power memory access requests. For example, in typical solid state drives, write accesses demand more power than read accesses. As such, in block 316, the drive controller may throttle write memory requests. Of course, in other solid state drives, read accesses may demand more power than write accesses and, in such embodiments, the drive controller 102 may be configured to throttle read requests while not throttling write requests in block 312.

As discussed above, the drive controller 102 may implement any suitable methodology to throttle the high power memory access requests. For example, in some embodiments in block 318, the drive controller 102 may delay the high power memory access requests by embedding a wait period between the performance of each high power memory access. Additionally or alternatively, in block 320, the drive controller 102 may delay the sending of an acknowledgement to the host 250 or other requesting entity after performing the high power memory access. Regardless, after the drive controller 102 has initiated throttling of the high power memory access requests in block 312, the method 300 loops back to block 304 in which the drive controller 102 continues monitoring the operational characteristic.

Referring back to block 310, if the drive controller 102 determines that the operational characteristic does satisfy the high threshold, the method 300 advances to block 322. In block 322, the drive controller throttles all memory access requests. For example, in block 324, the drive controller 102 throttles both read and write access requests. As discussed above, the drive controller 102 may implement any suitable methodology to throttle the memory access requests. For example, in block 326, the drive controller 102 may delay the read and write memory access requests by embedding a wait period between the performance of each memory access. Additionally or alternatively, in block 328, the drive controller 102 may delay the sending of an acknowledgement to the host 250 or other requesting entity after performing each memory access. Regardless, after the drive controller 102 has initiated throttling of the memory access requests in block 322, the method 300 loops back to block 304 in which the drive controller 102 continues monitoring the operational characteristic.

Referring back to block 308, if the drive controller 102 determines that the operational characteristic does not satisfy the low threshold, the method 300 advances to block 330. In block 330, the drive controller 102 determines and analyzes the historic trend of the monitored operational characteristic. To do so, the drive controller 102 may determine the change in the operational characteristic over time (e.g., by determining the slope or derivative of the operational characteristic). As such, the drive controller 102 may be configured to store values of the operational characteristic over time to facilitate the determination of the historic trend.

In block 332, the drive controller determines whether to preemptively throttle memory accesses based on the historical trend of the operational characteristic. To do so, the drive controller 102 may be configured to compare the historical trend to a trend threshold (e.g., by comparing the slope or derivative to a threshold value or equation). If the drive controller 102 determines that the historic trend satisfies the trend threshold, the method 300 advances to block 312 in which the drive controller throttles high power memory access requests as discussed above.

If, however, the historic trend does not satisfy the trend threshold, the method 300 advances to block 334. In block 334, the drive controller 102 un-throttles any implemented throttling of the performance of the solid state drive 100. The method 300 subsequently loops back to block 304 in which the drive controller 102 continues monitoring the operational characteristic of the solid state drive 100.

Figure 4:
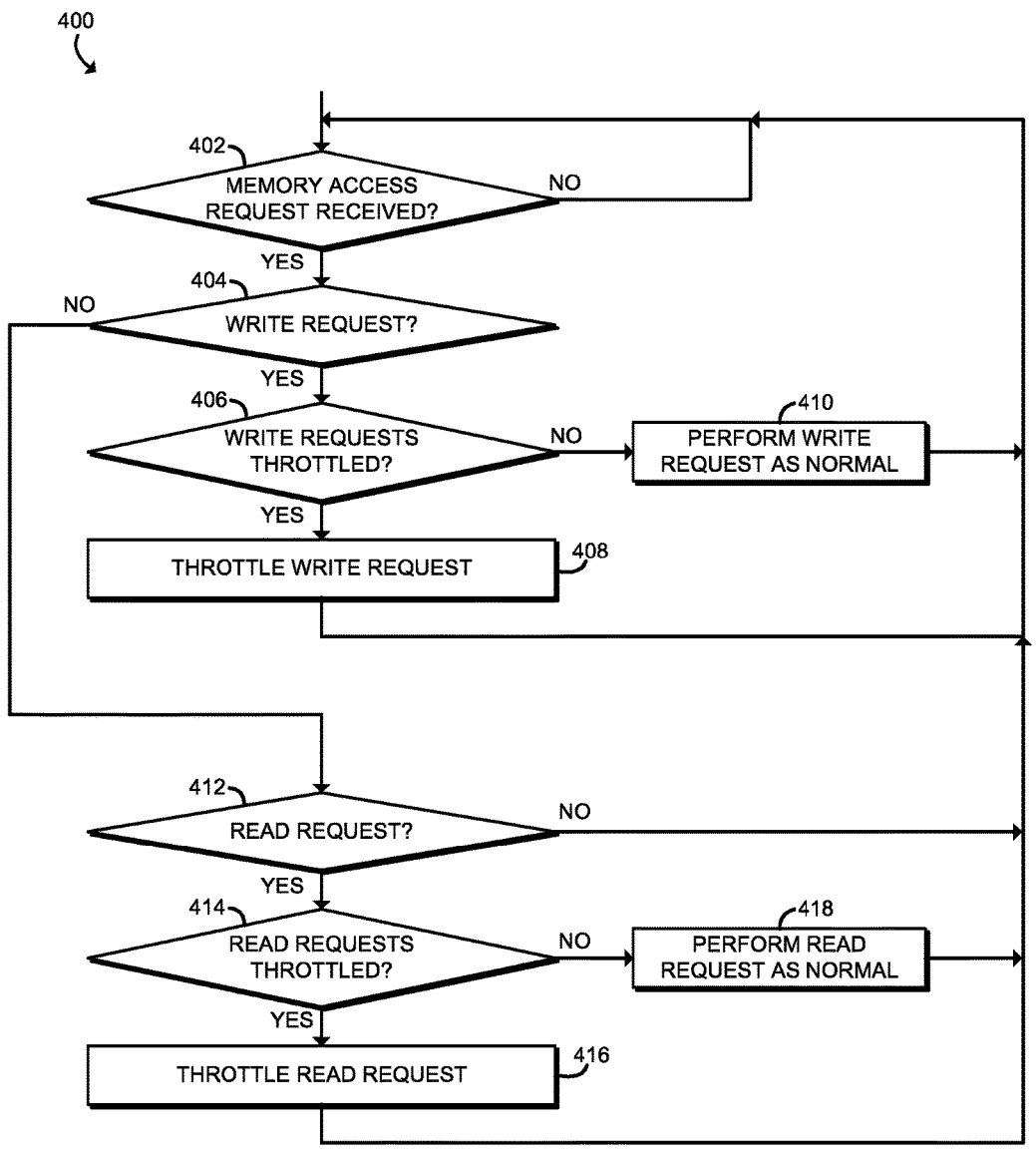
FIG. 4 is a simplified flow diagram of at least one embodiment of a method for managing memory access requests that may be executed by the drive controller of the solid state drive of FIGS. 1 and 2.

Referring now to FIG. 4, during operation, the drive controller 102 of the solid state drive 100 may execute a method 400 for managing memory access requests. The method 400 begins with block 402 in which the drive controller 102 determines whether a memory access request has been received. For example, a memory access request may be received from the host 250. If so, the method 400 advances to block 404 in which the drive controller 102 determines whether the memory access request is a write request. If so, the method 400 advances to block 406 in which the drive controller 102 determines whether write requests are presently being throttled. As discussed above, under some circumstances (e.g., when the operational characteristic is above the low threshold but below the high threshold), the write requests may be throttled while the read requests are not throttled.

If the drive controller 102 determines that write requests are presently throttled, the method 400 advances to block 408 in which the write request is throttled. For example, the performance of the write request may be artificially delayed and/or the acknowledgment of the performance of the write request to the host 250 may be delayed. If, however, the drive controller 102 determines that write requests are not throttled in block 406, the method 400 advances to block 410 in which the drive controller 102 performs the write request as normal. After the write request is throttled in block 408 or performed as normal in block 410, the method 400 loops back to block 402 in which the drive controller 102 continues to monitor for memory access requests.

Referring back to block 404, if the drive controller 102 determines that the memory access request is not a write request, the method 400 advances to block 412. In block 412, the drive controller 102 determines whether the memory access request is a read request. If not, the method 400 loops back to block 402 in which the drive controller 102 continues to monitor for memory access requests. If, however, the drive controller 102 determines that the memory access is a read request, the method 400 advances to block 414 in which the drive controller 102 determines whether read requests are presently being throttled. As discussed above, under some circumstances (e.g., when the operational characteristic is above the high threshold), both write and read requests may be throttled.

If the drive controller 102 determines that read requests are presently throttled, the method 400 advances to block 416 in which the read request is throttled. For example, the performance of the read request may be artificially delayed and/or the acknowledgment of the performance of the read request to the host 250 may be delayed. If, however, the drive controller 102 determines that read requests are not throttled in block 414, the method 400 advances to block 418 in which the drive controller 102 performs the read request as normal. After the read request is throttled in block 416 or performed as normal in block 418, the method 400 loops back to block 402 in which the drive controller 102 continues to monitor for memory access requests.

Figure 5:
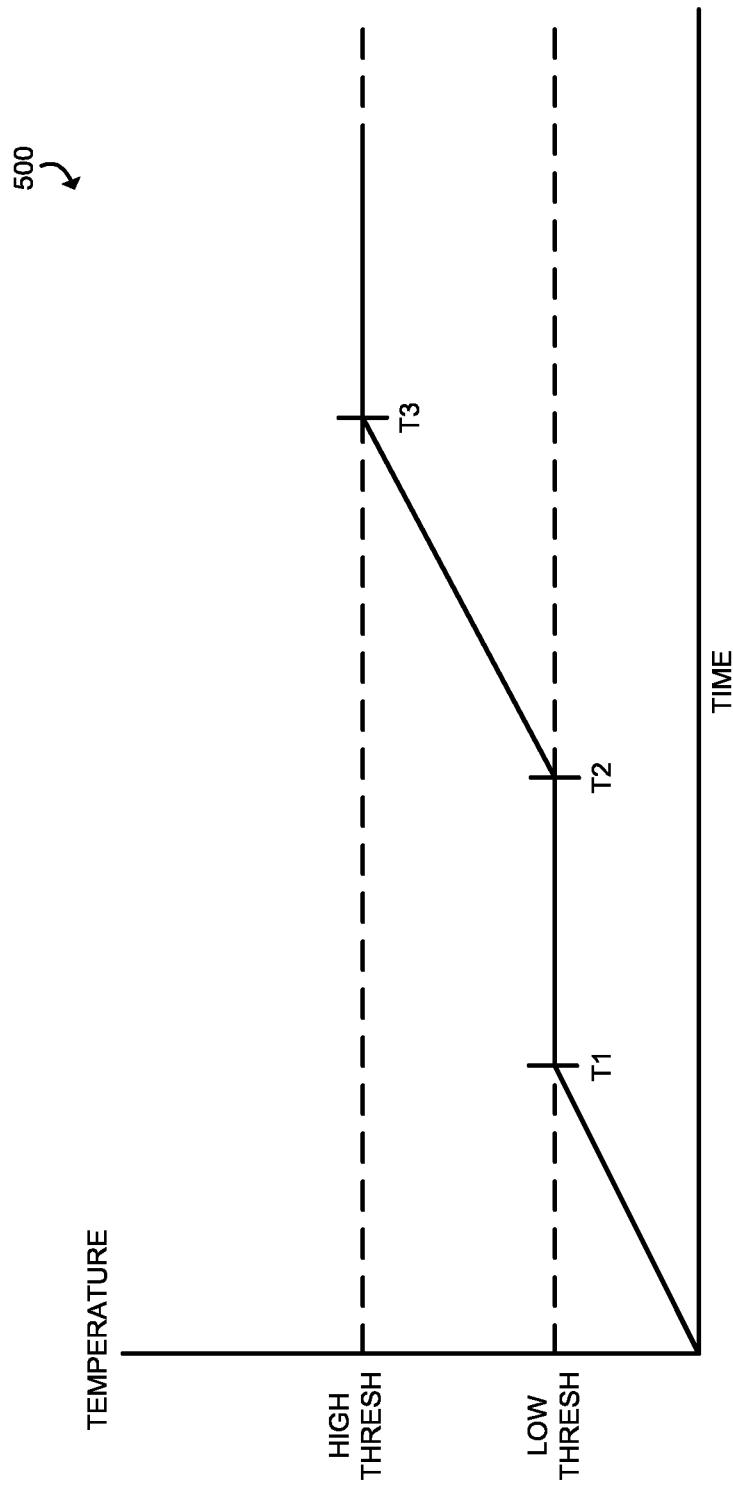
FIG. 5 is a simplified graph illustrating an example of an operational characteristic of the solid state drive of FIGS. 1 and 2 during execution of the methods of FIGS. 3 an 4.

Referring now to FIG. 5, a graph 500 illustrates an example of an operational characteristic of the solid state drive during operation according to one embodiment. In the illustrative embodiment, the monitored operational characteristic is embodied as the operational temperature of the solid state drive 100 as shown on the ordinate axis of graph 500 relative to time as shown on the abscissa axis of graph 500. In the illustrative example, the temperature of the solid state drive 100 increases up to the low threshold. When the temperature reaches the low threshold at time T1, the solid state drive 100 begins throttling high power memory accesses as discussed above. The throttling of the high power memory accesses causes the temperature of the solid state drive 100 to remain relatively constant for a period of time until time T2. At time T2, the workload of the solid state drive 100 increases at such a demand that throttling only high power memory accesses cannot hold the temperature of the solid state drive 100 constant (although it may increase the rise time). As such, at time T3, the temperature of the solid state drive 100 reaches the high threshold, and the solid state drive 100 begins throttling all memory accesses as discussed above. However, it should be appreciated that overall performance and user experience may be improved during the time between T1 and T3 because only high power memory accesses are throttled relative to typical all-or-nothing throttling schemes in which all memory accesses would be throttled during that time period.

Figure 6:
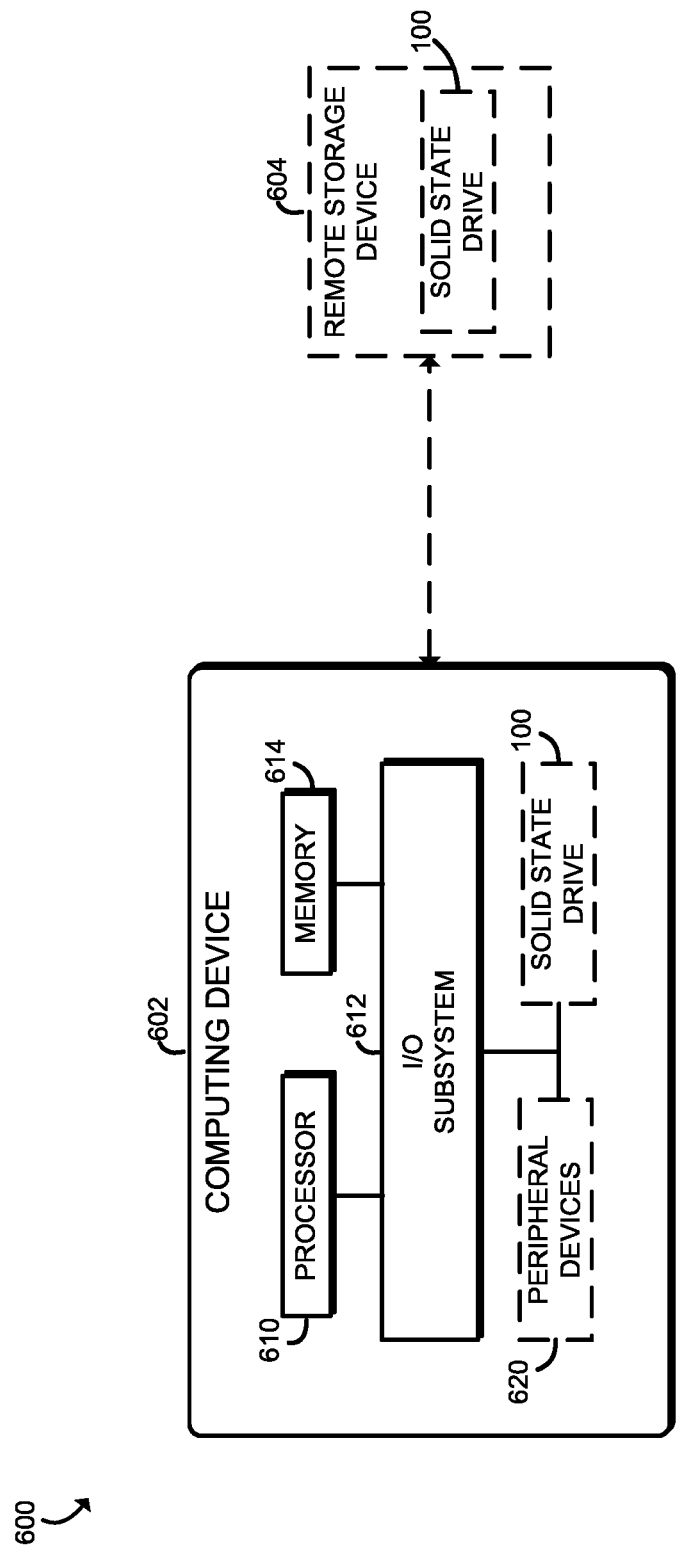
FIG. 6 is a simplified block diagram of at least one embodiment of a computing system including the solid state drive of FIG. 1.

Referring now to FIG. 6, in some embodiments, the solid state drive 100 may be form a portion of a computing system 600. For example, the solid state drive 100 may be incorporated into a computing device 602 and/or a remote storage device 604, which may be coupled to the computing device 602. The computing device 602 may be embodied as any type of computing device capable of communicating with the solid state drive 100 and/or the remote storage device 604 to access data stored on the solid state drive 100. For example, the computing device 602 may be embodied as a desktop computer, a mobile computing device, a notebook computer, a laptop computer, an enterprise computing system, a server, a server controller, a router, a switch, a smart appliance, a distributed computing system, a multiprocessor system, and/or any other computing device. As shown in FIG. 6, the illustrative computing device 602 includes a processor 610, an I/O subsystem 612, and memory 614. In some embodiments, the computing device 602 may include the solid state drive 100 as a component of the device 602. Additionally, the computing device 602 may include additional peripheral devices 620 in some embodiments. Of course, the computing device 602 may include other or additional components, such as those commonly found in a computer (e.g., various input/output devices), in other embodiments. Additionally, in some embodiments, one or more of the illustrative components may be incorporated in, or otherwise from a portion of, another component. For example, the memory 614, or portions thereof, may be incorporated in the processor 610 in some embodiments.

The processor 610 may be embodied as any type of processor capable of performing the functions described herein. For example, the processor 610 may be embodied as a single or multi-core processor(s), digital signal processor, microcontroller, or other processor or processing/controlling circuit. Similarly, the memory 614 may be embodied as any type of volatile or non-volatile memory or data storage capable of performing the functions described herein. The memory 614 is communicatively coupled to the processor 610 via the I/O subsystem 612, which may be embodied as circuitry and/or components to facilitate input/output operations with the processor 610, the memory 614, the solid state drive 100 (in embodiments in which the solid state drive 100 forms a portion of the computing device 602), and other components of the computing device 602. For example, the I/O subsystem 612 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The remote storage device 604 may be embodied as any type of data storage device remote capable of operating remotely from the computing device 602. For example, the remote storage device 604 may be embodied as a remote data server, remote computing device, and/or other electronic device capable of managing access requests to the local solid state drive 100. In some embodiments, for example, the remote storage device 604 may be embodied as a remote data server with which the computing device 602 communicates to access data stored on the solid state drive 100 of the remote storage device 604.

EXAMPLES

Illustrative examples of the technologies disclosed herein are provided below. An embodiment of the technologies may include any one or more, and any combination of, the examples described below.

Example 1 includes a solid state drive for managing an operational characteristic. The solid state drive includes an operational sensor to sense an operational characteristic of the solid state drive and a drive controller to (i) determine whether the operational characteristic satisfies a first operational characteristic threshold and (ii) throttle, in response to a determination that the operational characteristic satisfies the first operational characteristic threshold, high power memory access requests while not throttling low power memory access requests.

Example 2 includes the subject matter of Example 1, and wherein the operational sensor comprises a temperature sensor to sense a temperature of the solid state drive.

Example 3 includes the subject matter of Examples 1 or 2, and wherein the first operational characteristic threshold comprises a first temperature threshold.

Example 4 includes the subject matter of any of Examples 1-3, and wherein to throttle high power memory access requests comprises to throttle write requests while not throttling read requests.

Example 5 includes the subject matter of any of Examples 1-4, and wherein to throttle write requests comprises to delay the completion of write requests.

Example 6 includes the subject matter of any of Examples 1-5, and wherein to throttle write requests comprises to delay the sending of an acknowledgment to a host that requested a write operation to the solid state drive after completion of the write operation.

Example 7 includes the subject matter of any of Examples 1-6, and wherein to throttle high power memory access requests comprises to throttle write requests while not throttling read requests.

Example 8 includes the subject matter of any of Examples 1-7, and wherein to throttle write requests comprises to delay the completion of write requests.

Example 9 includes the subject matter of any of Examples 1-8, and wherein to throttle write requests comprises to delay the sending of an acknowledgment to a host that requested a write operation to the solid state drive after performing the write operation.

Example 10 includes the subject matter of any of Examples 1-9, and wherein the drive controller is further to determine whether the operational characteristic satisfies a second operational characteristic threshold greater than the first operational characteristic threshold in response to a determination that the operational characteristic satisfies the first operational characteristic threshold; and throttle, in response to a determination that the operational characteristic satisfies the second operational characteristic threshold, all memory access requests.

Example 11 includes the subject matter of any of Examples 1-10, and wherein the drive controller is further to determine a historical trend of the operational characteristic in response to a determination that the operational characteristic does not satisfy the first second operational characteristic threshold; determine whether the historical trend satisfies a trend threshold; and throttle, in response to a determination that the historic trend of the operational characteristic satisfies the first trend threshold, high power memory access requests while not throttling low power memory access requests.

Example 12 includes the subject matter of any of Examples 1-11, and wherein the operational characteristic comprises a temperature of the solid state drive.

Example 13 includes the subject matter of any of Examples 1-12, and wherein to determine a historical trend of the operational characteristic comprises to determine a slope of a temperature of the solid state drive.

Example 14 includes the subject matter of any of Examples 1-13, and wherein to throttle high power memory access requests comprises to throttle write requests while not throttling read requests.

Example 15 includes a method for managing an operational characteristic of a solid state drive. The method includes monitoring, by a drive controller of the solid state drive, an operational characteristic of the solid state drive; determining, by the drive controller, whether the operational characteristic satisfies a first operational characteristic threshold; and throttling, by the drive controller and in response to a determination that the operational characteristic satisfies the first operational characteristic threshold, high power memory access requests while not throttling low power memory access requests.

Example 16 includes the subject matter of Example 15, and wherein monitoring the operational characteristic comprises monitoring an operational temperature of the solid state drive.

Example 17 includes the subject matter of Examples 15 or 16, and wherein determining whether the operational characteristic satisfies a first operational characteristic threshold comprises determining whether the operational temperature satisfies a first temperature threshold.

Example 18 includes the subject matter of any of claims 15-17, and wherein throttling high power memory access requests comprises throttling write requests while not throttling read requests.

Example 19 includes the subject matter of any of claims 15-18, and wherein throttling write requests comprises delaying the completion of write requests.

Example 20 includes the subject matter of any of claims 15-19, and wherein throttling write requests comprises delaying sending an acknowledgment to a host that requested a write operation to the solid state drive after performing the write operation.

Example 21 includes the subject matter of any of claims 15-20, and wherein throttling high power memory access requests comprises throttling write requests while not throttling read requests.

Example 22 includes the subject matter of any of claims 15-21, and wherein throttling write requests comprises delaying the completion of write requests.

Example 23 includes the subject matter of any of claims 15-22, and wherein throttling write requests comprises delaying sending an acknowledgment to a host that requested a write operation to the solid state drive after performing the write operation.

Example 24 includes the subject matter of any of claims 15-23, and further comprising determining, by the drive controller, whether the operational characteristic satisfies a second operational characteristic threshold greater than the first operational characteristic threshold in response to a determination that the operational characteristic satisfies the first operational characteristic threshold; and throttling, by the drive controller and in response to a determination that the operational characteristic satisfies the second operational characteristic threshold, all memory access requests.

Example 25 includes the subject matter of any of claims 15-24, and further comprising determining, by the drive controller, a historical trend of the operational characteristic in response to a determination that the operational characteristic does not satisfy the first second operational characteristic threshold; determining, by the drive controller, whether the historical trend satisfies a trend threshold; and throttling, by the drive controller and in response to a determination that the historic trend of the operational characteristic satisfies the first trend threshold, high power memory access requests while not throttling low power memory access requests.

Example 26 includes the subject matter of any of claims 15-25, and wherein the operational characteristic comprises a temperature of the solid state drive.

Example 27 includes the subject matter of any of claims 15-26, and wherein determining a historical trend of the operational characteristic comprises determining a slope of a temperature of the solid state drive.

Example 28 includes the subject matter of any of claims 15-27, and wherein throttling high power memory access requests comprises throttling write requests while not throttling read requests.

Example 29 includes one or more machine-readable storage media comprising a plurality of instructions stored thereon that, when executed, cause a solid state drive to perform the method of any of Examples 15-28.

Example 30 includes a solid state drive for managing an operational characteristic. The solid state drive comprising means for monitoring an operational characteristic of the solid state drive; means for determining whether the operational characteristic satisfies a first operational characteristic threshold; and means for throttling, in response to a determination that the operational characteristic satisfies the first operational characteristic threshold, high power memory access requests while not throttling low power memory access requests.

Example 31 includes the subject matter of Example 30, and wherein the means for monitoring the operational characteristic comprises means for monitoring an operational temperature of the solid state drive.

Example 32 includes the subject matter of Examples 30 or 31, and wherein the means for determining whether the operational characteristic satisfies a first operational characteristic threshold comprises means for determining whether the operational temperature satisfies a first temperature threshold.

Example 33 includes the subject matter of any of Examples 30-32, and wherein the means for throttling high power memory access requests comprises means for throttling write requests while not throttling read requests.

Example 34 includes the subject matter of any of Examples 30-33, and wherein the means for throttling write requests comprises means for delaying the completion of write requests.

Example 35 includes the subject matter of any of Examples 30-34, and wherein the means for throttling write requests comprises delaying means for sending an acknowledgment to a host that requested a write operation to the solid state drive after performing the write operation.

Example 36 includes the subject matter of any of Examples 30-35, and wherein the means for throttling high power memory access requests comprises means for throttling write requests while not throttling read requests.

Example 37 includes the subject matter of any of Examples 30-36, and wherein the means for throttling write requests comprises means for delaying the completion of write requests.

Example 38 includes the subject matter of any of Examples 30-37, and wherein the means for throttling write requests comprises means for delaying sending an acknowledgment to a host that requested a write operation to the solid state drive after performing the write operation.

Example 39 includes the subject matter of any of Examples 30-38, and further comprising means for determining whether the operational characteristic satisfies a second operational characteristic threshold greater than the first operational characteristic threshold in response to a determination that the operational characteristic satisfies the first operational characteristic threshold; and means for throttling, in response to a determination that the operational characteristic satisfies the second operational characteristic threshold, all memory access requests.

Example 40 includes the subject matter of any of Examples 30-39, and further comprising means for determining a historical trend of the operational characteristic in response to a determination that the operational characteristic does not satisfy the first second operational characteristic threshold; means for determining whether the historical trend satisfies a trend threshold; and means for throttling, in response to a determination that the historic trend of the operational characteristic satisfies the first trend threshold, high power memory access requests while not throttling low power memory access requests.

Example 41 includes the subject matter of any of Examples 30-40, and wherein the operational characteristic comprises a temperature of the solid state drive.

Example 42 includes the subject matter of any of Examples 30-41, and wherein the means for determining a historical trend of the operational characteristic comprises means for determining a slope of a temperature of the solid state drive.

Example 43 includes the subject matter of any of Examples 30-42, and wherein the means for throttling high power memory access requests comprises means for throttling write requests while not throttling read requests.

The invention claimed is:

1. A method for managing an operational characteristic of a solid state drive, the method comprising:
monitoring, by a drive controller of the solid state drive, an operational characteristic of the solid state drive;

determining, by the drive controller, whether the operational characteristic satisfies a first operational characteristic threshold;

throttling, by the drive controller and in response to a determination that the operational characteristic satisfies the first operational characteristic threshold, high power memory access requests while not throttling low power memory access requests;

determining, by the drive controller, whether the operational characteristic satisfies a second operational characteristic threshold greater than the first operational characteristic threshold after the determination that the operational characteristic satisfies the first operational characteristic threshold; and throttling, by the drive controller and in response to a determination that the operational characteristic satisfies the second operational characteristic threshold, all memory access requests.

2. The method of claim 1, wherein monitoring the operational characteristic comprises monitoring an operational temperature of the solid state drive.

3. The method of claim 2, wherein determining whether the operational characteristic satisfies a first operational characteristic threshold comprises determining whether the operational temperature satisfies a first temperature threshold.

4. The method of claim 3, wherein throttling high power memory access requests comprises throttling write requests while not throttling read requests.

5. The method of claim 4, wherein throttling write requests comprises delaying the completion of write requests.

6. The method of claim 4, wherein throttling write requests comprises delaying sending an acknowledgment to a host that requested a write operation to the solid state drive after performing the write operation.

7. The method of claim 1, further comprising:
determining, by the drive controller, a historical trend of the operational characteristic in response to a determination that the operational characteristic does not satisfy the first second operational characteristic threshold;
determining, by the drive controller, whether the historical trend satisfies a trend threshold; and
throttling, by the drive controller and in response to a determination that the historic trend of the operational characteristic satisfies the first trend threshold, high power memory access requests while not throttling low power memory access requests.

8. A solid state drive for managing an operational characteristic, the solid state drive comprising:
an operational sensor to sense an operational characteristic of the solid state drive; and
a drive controller to:
determine whether the operational characteristic satisfies a first operational characteristic threshold;
throttle, in response to a determination that the operational characteristic satisfies the first operational characteristic threshold, high power memory access requests while not throttling low power memory access requests;
determine whether the operational characteristic satisfies a second operational characteristic threshold greater than the first operational characteristic threshold after the determination that the operational characteristic satisfies the first operational characteristic threshold; and
throttle, in response to a determination that the operational characteristic satisfies the second operational characteristic threshold, all memory access requests.

9. The solid state drive of claim 8, wherein the operational sensor comprises a temperature sensor to sense a temperature of the solid state drive.

10. The solid state drive of claim 9, wherein the first operational characteristic threshold comprises a first temperature threshold.

11. The solid state drive of claim 10, wherein to throttle high power memory access requests comprises to throttle write requests while not throttling read requests.

12. The solid state drive of claim 11, wherein to throttle write requests comprises to delay the completion of write requests.

13. The solid state drive of claim 11, wherein to throttle write requests comprises to delay the sending of an acknowledgment to a host that requested a write operation to the solid state drive after completion of the write operation.

14. The solid state drive of claim 8, wherein to throttle high power memory access requests comprises to throttle write requests while not throttling read requests.

15. The solid state drive of claim 8, wherein the drive controller is further to:
determine a historical trend of the operational characteristic in response to a determination that the operational characteristic does not satisfy the first second operational characteristic threshold;
determine whether the historical trend satisfies a trend threshold; and
throttle, in response to a determination that the historic trend of the operational characteristic satisfies the first trend threshold, high power memory access requests while not throttling low power memory access requests.

16. One or more machine-readable storage media comprising a plurality of instructions stored thereon that, when executed, cause a solid state drive to:
monitor an operational characteristic of the solid state drive;
determine whether the operational characteristic satisfies a first operational characteristic threshold;
throttle, in response to a determination that the operational characteristic satisfies the first operational characteristic threshold, high power memory access requests while not throttling low power memory access requests;
determine whether the operational characteristic satisfies a second operational characteristic threshold greater than the first operational characteristic threshold after the determination that the operational characteristic satisfies the first operational characteristic threshold; and
throttle, in response to a determination that the operational characteristic satisfies the second operational characteristic threshold, all memory access requests.

17. The one or more machine-readable storage media of claim 16, wherein to monitor the operational characteristic comprises to monitor an operational temperature of the solid state drive.

18. The one or more machine-readable storage media of claim 17, wherein to determine whether the operational characteristic satisfies a first operational characteristic threshold comprises to determine whether the operational temperature satisfies a first temperature threshold.

19. The one or more machine-readable storage media of claim 18, wherein to throttle high power memory access requests comprises to throttle write requests while not throttling read requests.

20. The one or more machine-readable storage media of claim 19, wherein to throttle write requests comprises to delay the completion of write requests.

21. The one or more machine-readable storage media of claim 19, wherein to throttle write requests comprises to delay sending an acknowledgment to a host that requested a write operation to the solid state drive after performing the write operation.

22. The one or more machine-readable storage media of claim 16, further the plurality of instructions, when executed, further cause the solid state drive to:
   determine a historical trend of the operational characteristic in response to a determination that the operational characteristic does not satisfy the first second operational characteristic threshold;
   determine whether the historical trend satisfies a trend threshold; and
   throttle, in response to a determination that the historic trend of the operational characteristic satisfies the first trend threshold, high power memory access requests while not throttling low power memory access requests.

* * * * *